United States Patent [19]

Yamada et al.

[11] Patent Number: 5,094,919

[45] Date of Patent: Mar. 10, 1992

[54] POLYIMIDE COPOLYMERS AND PROCESS FOR PREPARING THE SAME

[75] Inventors: Yasuharu Yamada; Nobuyuki Furukawa; Masaya Furukawa, all of Kitakyushu, Japan

[73] Assignee: Nippon Steel Chemical Co., Ltd., Tokyo, Japan

[21] Appl. No.: 371,860

[22] Filed: Jun. 27, 1989

[30] Foreign Application Priority Data

Jun. 30, 1988 [JP] Japan .................. 63-161002
Sep. 29, 1988 [JP] Japan .................. 63-242339

[51] Int. Cl.$^5$ ............................... B32B 9/06
[52] U.S. Cl. ................... 428/450; 528/26; 528/28
[58] Field of Search ............ 528/26, 28; 428/450

[56] References Cited

U.S. PATENT DOCUMENTS

| | | | |
|---|---|---|---|
| 3,325,450 | 6/1967 | Holub | 260/46.5 |
| 3,740,305 | 6/1973 | Hoback et al. | 161/183 |
| 4,040,874 | 8/1977 | Yerman | 148/33.3 |
| 4,672,099 | 6/1987 | Kunimune et al. | 528/28 |

FOREIGN PATENT DOCUMENTS

| | | |
|---|---|---|
| 0251828 | 1/1988 | European Pat. Off. . |
| 54-74677 | 6/1979 | Japan . |
| 58-218127 | 12/1983 | Japan . |
| 59-56453 | 3/1984 | Japan . |
| 60-76533 | 5/1985 | Japan . |
| 61-84025 | 4/1986 | Japan . |
| 62-223228 | 10/1987 | Japan . |

OTHER PUBLICATIONS

Patent Abstracts of Japan, vol. 3, No. 96 (E130), 15 Aug. 1979).
Bott, R. H. et al., "Synthesis and Characteristics of Novel Poly(Imide Siloxane) Segmented Copolymers", pp. 67-82, (1987).

Primary Examiner—Melvyn I. Marquis
Attorney, Agent, or Firm—Armstrong, Nikaido, Marmelstein, Kubovcik & Murray

[57] ABSTRACT

Polyimide copolymers of this invention have a repeating unit of the general formula (1)

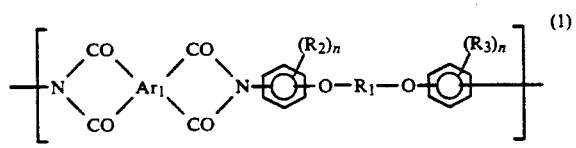

wherein $Ar_1$ is a tetravalent organic radical containing at least one aromatic ring, $R_1$ is a divalent organic radical, $R_2$ and $R_3$ are monovalent hydrocarbon radicals, and n is an integer from 0 to 4 and a repeating unit of the general formula (2)

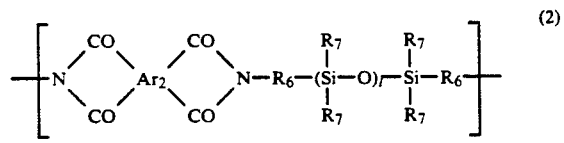

wherein $Ar_2$ is a tetravalent organic radical containing at least one aromatic ring, $R_6$ is a divalent organic radical, $R_7$ is a monovalent hydrocarbon radical with 1 to 6 carbon atoms, and l is an integer from 5 to 50 and are capable of forming films of a microdomain structure useful for such applications as protective films on semiconductors, coatings adhesives, moldings, films, and separation membranes.

11 Claims, 1 Drawing Sheet

POLYIMIDE COPOLYMERS AND PROCESS FOR PREPARING THE SAME

FIELD OF THE INVENTION AND RELATED ART STATEMENT

This invention relates to siloxane-modified polyimide copolymers containing siloxane blocks in a microphase separated structure and, more particularly, to polyimide copolymers which possess high mechanical, electrical, and thermal properties with good adhesion to substrates and are useful for protection of semiconductor devices.

As typically known in such applications as surface coatings on semiconductor devices, intermetallic insulation films in integrated circuits, passivation overcoats, die attach adhesives, and organic membranes for liquid crystal orientation, a number of processes have been proposed for improvement of the adhesion between silicone-based substrates and polyimide films; for example, pretreatment of the substrate surface with a coupling agent or introduction of alkoxysilyl or disiloxane groups into the polyimides as disclosed in Japan Tokkyo Kokai Koho No. 60-76,533 (1985). Polyimide precursors thereby prepared are known to change into polyimides on heating and produce excellent adhesion to the surface of the substrate.

The polyimides obtained in this manner, however, suffer lowering of both glass transition temperature and thermal decomposition temperature as the siloxane content increases, accompanied by lowering of the moisture resistance and mechanical properties and by an inevitable increase in thermal expansion coefficient.

Another approach is the copolymerization of diaminosiloxanes to lower the modulus of elasticity of polyimide films as disclosed in Japan Tokkyo Kokai Koho No. 62-223,228 (1987).

The polyimides obtained by a process such as this show an occurrence of phase separation on a macroscopic level, which hinders the formation of transparent films or coats, lowers mechanical and electrical properties for a loss in practical value, and unavoidably increases the thermal expansion coefficient.

A paper has been published on the preparation of siloxane-modified polyimides with a microphase separated structure or microdomain structure by BoH et al. in J. Adhesion, Vol. 23, p. 67-87 (1987).

The polyimides in question have not attained a sufficiently high degree of polymerization and showed such a gap in miscibility of the aromatic and siloxane components as to adversely affect the transparency and mechanical properties.

Solvent-soluble siloxane-containing polyimides are described in U.S. Pat. Nos. 3,325,450 and 3,740,305. These polyimides contain high proportions of siloxanes and are not satisfactory in respect to heat resistance or mechanical properties.

Coupled with a recent trend towards larger-sized chips and thinner lines in semiconductor devices, factors such as post-cure shrinkage of resin encapsulants, stress generated by mismatched thermal expansion of chips and encapsulants, and fillers in encapsulants, are becoming more responsible for higher incidence of sliding dislocation of electrodes and cracking of passivation layers with resultant reduction in the moisture resistance.

Efforts have been made to design low-stress encapsulants in order to reduce the number of rejects from the aforesaid causes. On the other hand, an increasing number of attempts have been made to lower the stress to the chips by forming a polyimide film with a thickness of 2 to 5 $\mu$m on an inorganic passivation film. Polyimides of low modulus of elasticity with good stress relaxation are generally recognized to be effective for this purpose.

On the other hand, it has been proved that the penetration of alpha-particles into high-density semiconductor memory devices causes soft errors. Moreover, there is a tendency for the cell area to decrease and for the vulnerability to soft errors to increase as the scale of integration increases in the semiconductor memory devices and it is thought mandatory to provide alpha-particle barriers in memory devices of 4M bits or more.

A variety of processes have been proposed for these purposes. For example, one is to use polyamic acids with improved adhesion to semiconductor devices for surface protection as disclosed in Japan Tokkyo Kokai Koho Nos. 59-56, 453 (1984) and 61-84, 025 (1986). Another is to use polyamic acids of high heat resistance for surface protection as described in Japan Tokkyo Kokai Koho Nos. 58-218, 127 (1983) and 54-74, 677 (1979). These processes, however, do not furnish sufficient moisture resistance and stress relaxation and furthermore polyimides themselves, because of their relatively high dielectric constants, are not well suited for the protection of semiconductor devices.

OBJECT AND SUMMARY OF THE INVENTION

An object of this invention is to overcome the aforesaid problems relating to the conventional polyimides and to provide transparent polyimide copolymers of a microdomain structure with excellent film properties and a process for preparing the same.

Another object of this invention is to provide polyimide copolymers which are soluble in organic solvents and have excellent electrical, mechanical, and thermal properties and a process for preparing the same.

Still another object of this invention is to provide polyimide copolymers of low modulus of elasticity, low moisture absorption, low dielectric constant, and low thermal expansion and a process for preparing the same.

A further object of this invention is to provide polyimide copolymers which are useful for such applications as protective films on semiconductor devices, coatings, adhesives, molding materials, films, and separation membranes and a process for preparing the same.

A still further object of this invention is to provide polyimide copolymers which possess low modulus of elasticity, low moisture absorption, low dielectric constant, and low thermal expansion, adhere strongly to silicon wafers, contain 0.1 ppb or less each of uranium and thorium, yield good results when used as buffer coats, alpha-particle barriers, passivation films, and the like in semiconductor devices, and protect semiconductors against thermal shock and soft errors and a process for preparing the same.

An additional object of this invention is to provide a resin composition for protection of semiconductor devices which comprises polyimide copolymers of low modulus of elasticity, low moisture absorption, low dielectric constant, and low thermal expansion producing good adhesion to silicon wafers and containing 0.1 ppb or less each of uranium and thorium and to provide semiconductor devices protected with films made from said resin composition against thermal shock and soft errors.

This invention accordingly relates to polyimide copolymers having a repeating unit of the general formula (1)

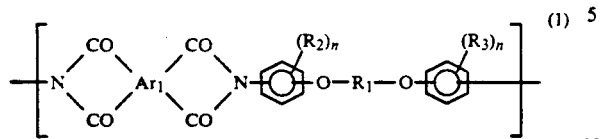

wherein $Ar_1$ is a tetravalent organic radical containing at least one aromatic ring, $R_1$ is a divalent organic radical, $R_2$ and $R_3$ are monovalent hydrocarbon radicals, and n is an integer from 0 to 4 and a repeating unit of the general formula (2)

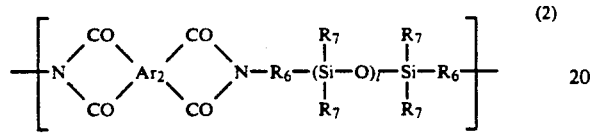

wherein $Ar_2$ is a tetravalent organic radical containing at least one aromatic ring, $R_6$ is a divalent organic radical, $R_7$ is a monovalent hydrocarbon radical with 1 to 6 carbon atoms, and l is an integer from 5 to 50 and capable of forming a film with a microdomain structure.

This invention also relates to a process for the preparation of polyimide precursors useful for the formation of a film with a microdomain structure which comprises polycondensing diamine components consisting of 50 to 99 mole % of diamino compounds of the general formula (5)

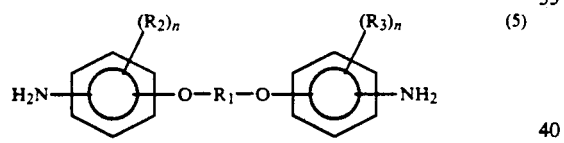

wherein $R_1$ is a divalent radical, $R_2$ and $R_3$ are monovalent hydrocarbon radicals, and n is an integer from 0 to 4 and 1 to 50 mole % of diaminosiloxanes of the general formula (6)

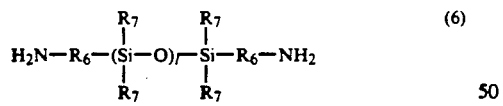

wherein $R_6$ is a divalent organic radical, $R_7$ is a monovalent hydrocarbon radical with 1 to 6 carbon atoms, and l is an integer from 5 to 50 with aromatic tetracarboxylic acid dianhydrides and to a process for the preparation of polyimide copolymers which comprises imidizing said polyimide precursors.

This invention further relates to a resin composition for protection of semiconductor devices mainly composed of polyimide copolymers having the repeating units of the above-mentioned general formulas (1) and (2) and capable of forming a film with a microdomain structure and to semiconductor devices fitted with a protective film of said resin composition containing said polyimide copolymers.

In the process of this invention, the tetracarboxylic acid-derived radicals $Ar_1$ and $Ar_2$ constituting the polyimide blocks are organic radicals containing at least one aromatic ring and preferably a tetravalent organic radical of the general formula (3)

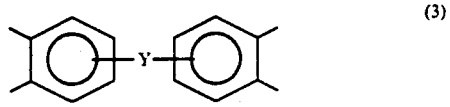

wherein Y is nil, —CO—, —SO$_2$—, —O—, —C(CH$_3$)$_2$—, or —C(CF$_3$)$_2$—. Examples of the tetracarboxylic acid dianhydride-derived tetravalent organic radicals include the following compounds:

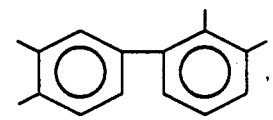

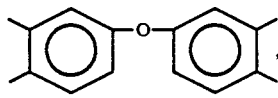

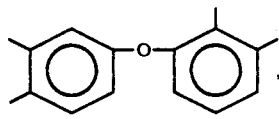

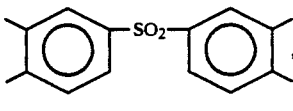

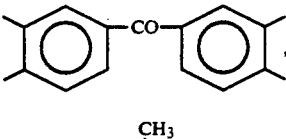

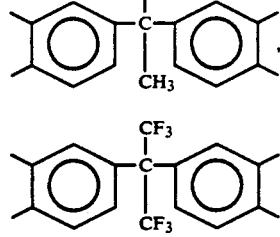

The integer l in the siloxane polyimide blocks of the general formula (2) is from 5 to 50, preferably from 5 to 30. The effect for lowering the modulus of elasticity is relatively less pronounced when l is less than 5 while the reactivity with tetracarboxylic acid dianhydrides decreases, the siloxane blocks become more difficult to form, and the resulting polyimides show poor adhesion to the substrate when l is 30 or more.

In the polyimide copolymers of this invention, the proportion of the repeating unit of the general formula (2) is normally from 1 to 70% by weight, preferably from 10 to 50% by weight, of the whole polyimides. It is allowable to use in part siloxane polyimide blocks of the general formula (2) with l of from 1 to 4 for the purpose of improving the adhesive strength, but the amount of such blocks should preferably be kept in the range of 0.5 to 5% by weight. The adhesive strength is not expected to improve with addition of less than 0.5% by weight while the heat resistance decreases with addition in excess of 5% by weight.

The polyimide copolymers of this invention, having a microdomain structure and capable of forming a film, can be prepared by the process of this invention and some of such polyimide copolymers exhibit good solubility in solvents.

The diaminosiloxanes of the general formula (6) to be used in the process of this invention should have molecular weights of 500 to 5,000, preferably 700 to 3,000. It is acceptable to use diaminosiloxanes having molecular weights of 200 to 800 in admixture with the foregoing.

The diaminosiloxanes of the general formula (6) to be used for this purpose are exemplified by

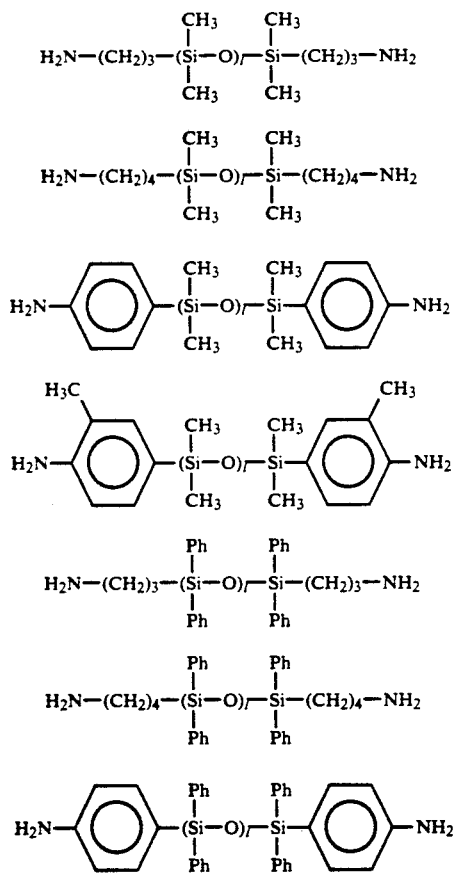

wherein Ph denotes the phenyl group, and they are used singly or mixed.

Prior art processes are applicable to the preparation of the polyimide copolymers of this invention and a preferable one is to allow diaminosiloxanes of the general formula (6) to react with 2 molor equivalents or more, preferably 4 molor equivalents or more of tetracarboxylic acid dianhydrides to form siloxane-modified polybasic carboxylic acids in the first step. The tetracarboxylic acid dianhydrides to be used here are those which will result from the addition of acid anhydride groups to the $Ar_2$ radical in the general formula (2) and examples of such acid anhydrides include 3,3',4,4'-benzophenonetetracarboxylic acid dianhydride, 3,3',4,4'-biphenyltetracarboxylic acid dianhydride, 2,3',3,4'-biphenyltetracarboxylic acid dianhydride, 3,3',4,4'-diphenylsulfonetetracarboxylic acid dianhydride, 3,3',4,4'-diphenylethertetracarboxylic acid dianhydride, 2,3',4,4'-diphenylethertetracarboxylic acid dianhydride, and 2,2-bis(3,4-dicarboxyphenyl)tetrafluoropropane dianhydride. It is allowable to use, as part of the aforesaid tetracarboxylic acid dianhydrides pyromellitic acid dianhydride, 2,3,6,7-naphthalenetetracarboxylic acid dianhydride, 1,2,5,6-naphthalenetetracarboxylic acid dianhydride, 1,4,5,8-naphthalenetetracarboxylic acid dianhydride, 2,3,6,7-anthracenetetracarboxylic acid dianhydride, 1,2,7,8-phenanthrenetetracarboxylic acid dianhydride, 3,4,9,10-perylenetetracarboxylic acid dianhydride, and 4,4-bis(2,3-dicarboxyphenoxy)diphenylmethane dianhydride.

Upon completion of the first-step reaction, the remainder of the tetracarboxylic acid components and the diamine components consisting mainly of the diamino compounds of the general formula (5) are added and the reaction is continued.

The remainder of the tetracarboxylic acid components here means the acid anhydrides derived from the addition of acid anhydride groups to the $Ar_1$ radical in the general formula (1) and they may be the same as those which are derived from the addition of acid anhydride groups to the $Ar_2$ radical in the general formula (2) for use in the preparation of the siloxane polyimide blocks of the general formula (2), and the $Ar_1$-derived ones may be identical with or different from $Ar_2$-derived ones.

The diamines to be used for the preparation of the polyimide blocks of the general formula (1) are mainly composed of the diamino compounds of the general formula (5) and their examples include 2,2-bis[4-(4-aminophenoxy)phenyl]propane, 2,2-bis[4-(3-aminophenoxy)phenyl]propane, bis[4-(4-aminophenoxy)phenyl] sulfone, bis[4-(3-aminophenoxy)phenyl] sulfone, 2,2-bis[4-(4-aminophenoxy)phenyl]hexafluoropropane, 2,2-bis[4-(3-aminophenoxy)phenyl]hexafluoropropane, bis[4-(4-aminophenoxy)]biphenyl, bis[1-(3-aminophenoxy)]biphenyl, bis[4-(4-aminophenoxy)phenyl]methane, bis[4-(3-aminophenoxy)phenyl]methane, bis[4-(4-aminophenoxy)phenyl] ether, bis[4-(3-aminophenoxy)phenyl] ether, bis[4-(4-aminophenoxy)]benzophenone, bis[4-(3-aminophenoxy)]benzophenone, bis[4,4'-(4-aminophenoxy)]benzanilide, bis[4,4'-(3-aminophenoxy)]benzanilide, 9,9-bis[4-(4-aminophenoxy)phenyl]fluorene, and 9,9-bis[4-(3-aminophenoxy)phenyl]fluorene. They may be used singly or mixed and may also be used together with small quantities of aromatic diamines other than the aforesaid diether-diamines.

Such aromatic amines to be used along with the diamino compounds of the general formula (5) include m-phenylenediamine, p-phenylenediamine, 4,4'-diaminodiphenylpropane, 4,4'-diaminodiphenylmethane, 4,4'-diaminodiphenyl ether, benzidine, 4,4'-diaminodiphenyl sulfide, 4,4'-diaminodiphenyl sulfone, 3,4'-diaminodiphenyl ether, 2,6-diaminopyridine, 3,3'-dimethoxybenzidine, 1,4-bis(4-aminophenoxy)benzene, 1,3-bis(aminophenoxy)benzene, 4,4'-[1,4-phenylenebis(1-methylethylidene)]bisaniline, 4,4'-[1,3-phenylenebis(1-methylethylidene)]bisaniline, and 4,4'-oxydianiline.

The solvents to be used in the reaction system in the process of this invention must be inert to both the aromatic polyamic acids and the siloxane blocks. Typical examples are ethers such as diethylene glycol dimethyl ether (diglyme), diethylene glycol diethyl ether, and tetrahydrofuran and amides such as N,N-dimethylformamide, N,N-dimethylacetamide, N-methyl-2-pyrrolidone, and N-cyclohexyl-2-pyrrolidone. These solvents may be used singly or mixed and a solvent containing 10% by weight or more, preferably 30% by weight or more, of an ether is best suited.

The reaction is preferably carried out as follows in the process of this invention. The tetracarboxylic acid dianhydride is dispersed or dissolved in a solvent in advance, a diglyme solution of the diaminosiloxane of the general formula (6) is added slowly, and the mixture is allowed to react to form siloxane polyimide blocks containing the repeating unit of the general formula (2). Diamines mainly consisting of diamino compounds of the general formula (5) are then added to the reaction mixture to link the repeating units of the general formula (1) to form a solution of the polyimide precursors convertible to polyimide copolymers of a microdomain structure. The solution of the polyimide precursors thus obtained yield polyimide films of good properties. It is desirable to use 50 to 99 mole % of the diamino compounds and 1 to 50 mole % of the diaminosiloxanes from the viewpoint of minimizing a decrease in heat resistance and an increase in thermal expansion coefficient of the polyimide films resulting from the curing of the polyimide precursors.

The polyimide precursor solutions prepared in this manner are applicable by spin-coating even at high solid contents. When heated at a temperature of 50° to 250° C. for a short time, which is high and long enough for removal of the solvent, they yield polyimide copolymers which show good adhesion, excellent mechanical and electrical properties, low tensile modulus of elasticity, and large tensile elongation, possess a microdomain structure without pinholes, and are capable of sharply cutting down failures of semiconductor devices at high temperature and humidity. In addition, the polyimide copolymers are virtually free of uranium and thorium and serve satisfactorily as alpha-particle barriers when further coated with encapsulants based on epoxy resins or others, contributing greatly to improve reliability of the memory devices.

The polyimide copolymers have a total content of uranium and thorium not in excess of 0.2 ppb, which is a desirable qualification for surface-protecting films on semiconductor devices. Furthermore, formation of a microdomain structure between the siloxane blocks and the aromatic blocks in cured films leads to excellent moisture resistance, stress relaxation, and electrical properties.

The semiconductor devices utilizing the resin compositions consisting of or mainly consisting of the polyimide copolymers of this invention for protective films are encapsulated by ceramic packages, metallic packages such as metallic cans, or resin packages such as molded epoxy resins.

The resin compositions consisting of or mainly consisting of the polyimide copolymers of this invention yield particularly desirable results when encapsulated by resins and more so in high-density semiconductor devices, namely 1 kilobits or more for bipolar devices or 16 k bits for MOS devices.

Figure 1:
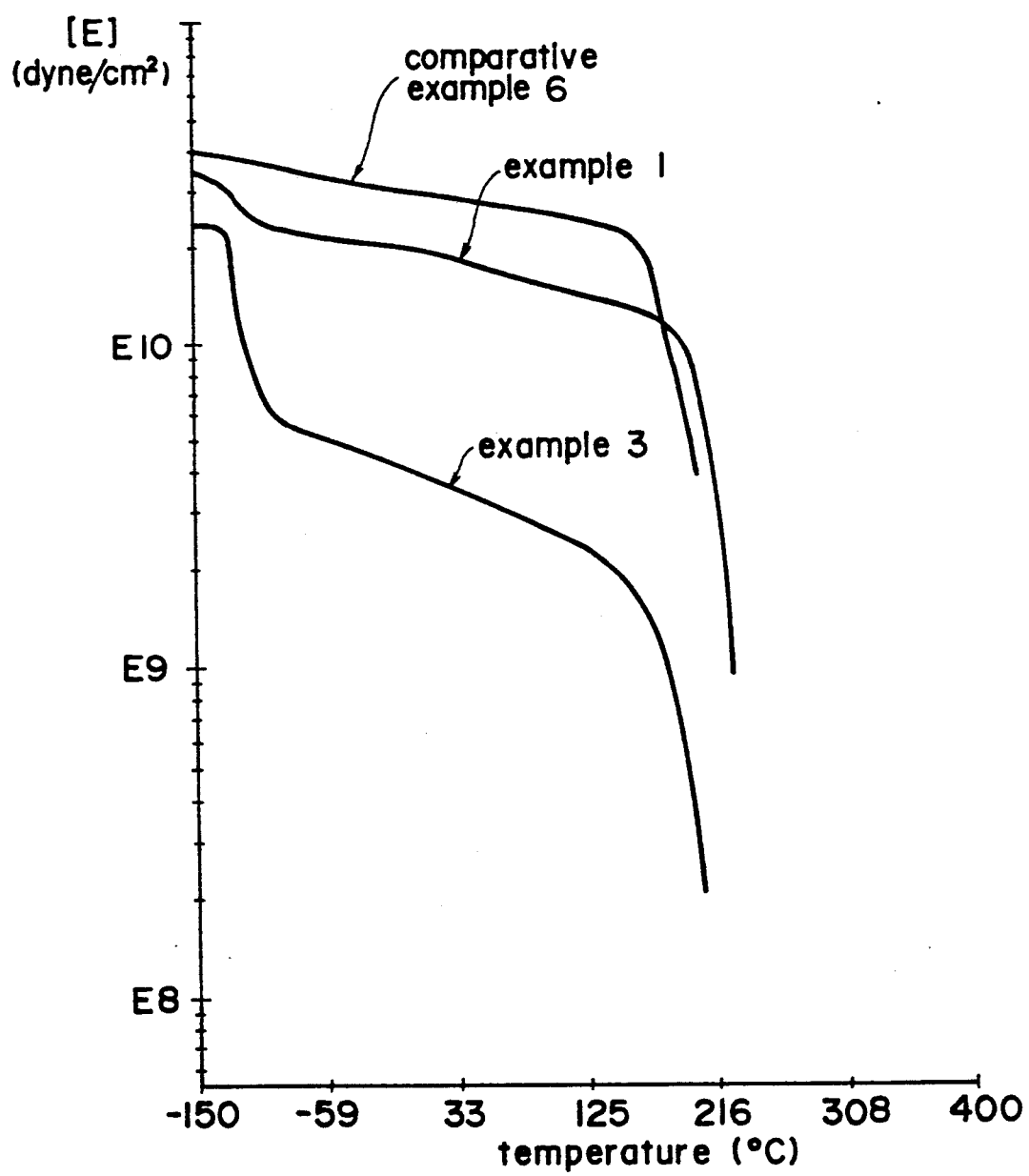
FIG. 1 is a graph showing the results of the tested dynamic viscoelasticity about the polyimide film obtained in Example 1, Example 3 and Comparative Example 6.

DETAILED DESCRIPTION OF THE PREFERRED EMBODIMENTS:

This invention is explained in detail with reference to the accompanying examples and comparative examples.

The following symbols are used in the examples and comparative examples.

BTDA: 3,3',4,4'-Benzophenonetetracarboxylic acid dianhydride
BPDA: 3,3',4,4'-Biphenyltetracarboxylic acid dianhydride
DEDA: 3,3',4,4'-Diphenylethertetracarboxylic acid dianhydride
DSDA: 3,3',4,4'-Diphenylsulfonetetracarboxylic acid dianhydride
6FDA: 4,4'-(Hexafluoroisopropylidene)diphthalic acid dianhydride
PMDA: Pyromellitic acid dianhydride
BAPP: Bis[4-(4-aminophenoxy)phenyl]propane
p-BAPS: Bis[4-(4-aminophenoxy)phenyl] sulfone
m-BAPS: Bis[4-(3-aminophenoxy)phenyl] sulfone
BAPF: 2,2-Bis[4-(4-aminophenoxy)phenyl]hexafluoropropane
ODA: 4,4'-Oxydianiline
GAPD: Bis(3-aminopropyl)tetramethyldisiloxane
PSX: Diaminosiloxane

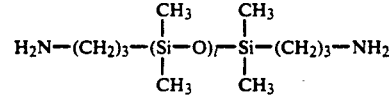

PSX-A: amine equivalent 472 (Mw=944)
PSX-B: amine equivalent 650 (Mw=1,300)
PSX-C: amine equivalent 1,280 (Mw=2,560)
PSX-D: amine equivalent 2,200 (Mw=4,400)
DIG: Diethylene glycol dimethyl ether
NMP: N-Methyl-2-pyrrolidone
DMAc: Dimethylacetamide
THF: Tetrahydrofuran.

EXAMPLE 1

To a dispersion of 32.20 g (0.10 mole) of BTDA in 365 g of DIG was added dropwise a dispersion of 13.00 g (0.01 mole) of PSX-B in 100 g of diglyme and the mixture was allowed to react.

After the formation of the siloxane blocks in this manner, 36.9 g (0.09 mole) of BAPP was added and the reaction was continued at 30° C. or less for 5 hours to yield a transparent solution of polyamic acids. The solution thus obtained was examined for its transparency and the content of uranium and thorium in ppb. The results are shown in Table 1.

The solution was cast on a glass plate and heated at 60° C. for 30 minutes, at 100° C. for 30 minutes, at 150° C. for 30 minutes, and at 250° C. for 60 minutes to give a transparent film of good properties.

The polyimide film thus obtained was tested for the tensile modulus of elasticity, tensile strength, elongation, initial thermal decomposition temperature, glass transition temperature, thermal expansion coefficient, dielectric constant, dielectric loss, light transmission, moisture absorption, and adhesion. The results are shown in Table 2.

The polyimide film was also tested for the dynamic viscoelasticity. The results are shown in FIG. 1.

The figure indicates lowering of the modulus by the siloxane blocks near −120° C. and yet a high light transmission, proving that the polyimide has a microdomain structure.

EXAMPLE 2-15

Polyimide precursors were synthesized as in Example 1 using the monomers and the solvents shown in Table 1, the precursors were made into a polyimide film, and the polyamic acid solution and the polyimide film were examined as in Example 1. The results are shown in Tables 1 and 2 respectively.

COMPARATIVE EXAMPLE 1

To a solution of 18.88 g (0.02 mole) of PSX-A with an amine equivalent of 472 and 32.80 g (0.08 mole) of BAPP in 475 g of NMP was added 32.20 g (0.10 mole) of BTDA in small portions and the mixture was allowed to react at 30° C. or less for 5 hours to yield a polymer solution. The solution was opaque and yield an opaque film when cast on a glass plate and heated at 100° C. for 30 minutes, at 250° C. for 30 minutes. As in Example 1, the polymer solution and the film were examined. The results are shown in Tables 1 and 2 respectively.

COMPARATIVE EXAMPLES 2-7

Polyimide precursors were synthesized as in Comparative Example 1 using the monomers and the solvents shown in Table 1, the precursors obtained were made into polyimide films, and the polyamic acid solutions and the polyimide films were examined as in Example 1. The results are shown in Tables 1 and 2 respectively.

TABLE 1

| | Example | | | | | | | | | | |
|---|---|---|---|---|---|---|---|---|---|---|---|
| | 1 | 2 | 3 | 4 | 5 | 6 | 7 | 8 | 9 | 10 | 11 |
| | Tetracarboxylic acid dianhydride (Upper row: Kind and Lower row: Part by mole) | | | | | | | | | | |
| Raw materials and their amounts for polymerization reaction | BTDA 100 | BTDA 100 | BTDA 100 | BTDA 100 | BTDA 100 | BTDA 100 | BTDA 80 DSDA 20 | BTDA 80 BPDA 20 | DSDA 100 | BTDA 80 6FDA 20 | DEDA 100 |
| | Diamino compound (Upper row: Kind and Lower row: Part by mole) | | | | | | | | | | |
| | BAPP 90 | BAPP 80 | BAPP 60 | p-BAPS 80 | m-BAPS 80 | BAPF 80 | BAPF 80 | p-BAPS 80 | BAPP 85 | BAPP 85 | BAPP 85 |
| | Diaminosiloxane (Upper row: Kind and Lower row: Part by mole) | | | | | | | | | | |
| | PSX-B 10 | PSX-B 20 | PSX-B 40 | PSX-C 20 | PSX-A 20 | PSX-A 20 | GAPD 5 PSX-B 15 | GAPD 10 PSX-B 10 | PSX-B 15 | PSX-B 15 | PSX-B 15 |
| Solution viscosity (cp) | 1500 | 1000 | 400 | 500 | 1200 | 1100 | 1500 | 2100 | 1050 | 1300 | 1200 |
| Reaction solvent | DIG | DIG | DIG | DIG | DIG | DIG | DIG + NMP 50/50 | DIG + NMP 50/50 | DIG + NMP 50/50 | DIG | DIG + NMP 50/50 |
| Siloxane* monomer (wt %) | 15.8 | 28.6 | 47.8 | 43.4 | 22.0 | 20.4 | 24.0 | 19.0 | 21.6 | 21.9 | 23.1 |
| Transparency of solution | ○ | ○ | ○ | ○ | ○ | ○ | ○ | ○ | ○ | ○ | ○ |
| Purity (ppb) | | | | | | | | | | | |
| U | 0.01 | 0.01 | 0.01 | 0.01 | 0.01 | 0.01 | 0.01 | 0.01 | 0.01 | 0.01 | 0.01 |
| Th | 0.01 | 0.01 | 0.01 | 0.01 | 0.01 | 0.01 | 0.01 | 0.01 | 0.01 | 0.01 | 0.01 |

| | Example | | | | Comparative Example | | | | | | |
|---|---|---|---|---|---|---|---|---|---|---|---|
| | 12 | 13 | 14 | 15 | 1 | 2 | 3 | 4 | 5 | 6 | 7 |
| | Tetracarboxylic acid dianhydride (Upper row: Kind and Lower row: Part by mole) | | | | | | | | | | |
| Raw materials and their amounts for polymerization reaction | BTDA 90 PMDA 10 | BTDA 100 | BTDA 80 BPDA 20 | BTDA 50 PMDA 50 | BTDA 100 | PMDA 100 | BPDA 100 | BTDA 100 | BTDA 100 | BTDA 80 PMDA 20 | BTDA 80 BPDA 20 |
| | Diamino compound (Upper row: Kind and Lower row: Part by mole) | | | | | | | | | | |
| | BAPP 70 ODA 10 | ODA 15 m-BAPS 65 | BAPP 80 | BAPP 80 | ODA 80 | BAPP 80 | p-BAPS 80 | p-BAPS 80 | BAPP 90 | BAPP 70 | p-BAPS 80 |
| | Diaminosiloxane (Upper row: Kind and Lower row: Part by mole) | | | | | | | | | | |
| | PSX-C 20 | PSX-A 20 | PSX-A 20 | PSX-A 20 | PSX-A 10 | PSX-C 20 | PSX-D 20 | GAPD 5 PSX-D 15 | PSX-A 10 | GAPD 30 | PSX-D 5 |
| Solution viscosity (cp) | 1500 | 2500 | 1500 | 5100 | 3500 | 1700 | 1200 | 1200 | 4500 | 3200 | 4400 |
| Reaction solvent | DIG + NMP 70/30 | DIG + THF 50/50 | DIG | NMP + DIG 70/30 | NMP | NMP | NMP | DMAc | NMP | FIG | DIG |
| Siloxane* monomer (wt %) | 45.3 | 29.1 | 23.7 | 25.1 | 28.1 | 48.4 | 57.9 | 56.9 | 15.8 | 11.2 | 26.1 |
| Transparency of solution | ○ | ○ | ○ | ○ | X | X | X | X | X | ○ | X |

TABLE 1-continued

| Purity (ppb) | | | | | | | | | | | |
|---|---|---|---|---|---|---|---|---|---|---|---|
| U | 0.01 | 0.01 | 0.01 | 0.01 | 0.01 | 0.01 | 0.01 | 0.01 | 0.02 | 0.02 | 0.02 |
| Th | 0.01 | 0.01 | 0.01 | 0.01 | 0.01 | 0.01 | 0.01 | 0.01 | 0.01 | 0.02 | 0.01 |

(Note) *% by weight based on the total monomers

TABLE 2

| Test item | Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Tensile modulus of elasticity*1 | 160 | 110 | 44 | 50 | 107 | 92 | 115 | 102 | 170 | 165 | 110 | 65 |
| Tensile strength*2 | 6.2 | 4.2 | 2.7 | 3.3 | 4.3 | 4.0 | 4.7 | 3.8 | 7.1 | 7.0 | 5.5 | 3.7 |
| Elongation*3 | 15 | 22 | 35 | 25 | 20 | 18 | 16 | 25 | 10 | 15 | 22 | 35 |
| Initial thermal decomposition temperature*4 | 450 | 435 | 380 | 410 | 430 | 490 | 440 | 420 | 480 | 490 | 410 | 455 |
| Glass transition temperature*5 | 210 | 220 | 180 | 230 | 195 | 210 | 200 | 170 | 230 | 225 | 195 | 200 |
| Thermal expansion coefficient*6 | 47 | 50 | 110 | 70 | 53 | 50 | 57 | 65 | 45 | 48 | 55 | 76 |
| Dielectric constant*7 | 2.9 | 2.8 | 2.7 | 2.8 | 2.9 | 2.9 | 2.9 | 2.9 | 3.0 | 2.8 | 2.9 | 2.8 |
| Dielectric loss*8 | 8.4 | 8.9 | 9.8 | 8.8 | 9.1 | 8.3 | 9.2 | 9.1 | 7.9 | 9.0 | 8.1 | 8.6 |
| Transparency*9 | ○ | ○ | ○ | ○ | ○ | ○ | ○ | ○ | ○ | ○ | ○ | ○ |
| Light transmission*10 | 66 | 73 | 72 | 77 | 80 | 82 | — | — | — | — | — | — |
| Moisture absorption (%) | 0.3 | 0.3 | 0.2 | 0.2 | 0.2 | 0.2 | — | — | — | — | — | — |
| Adhesion | 100 | 100 | 100 | 100 | 100 | 100 | 100 | 100 | 100 | 100 | 100 | 100 |

| Test item | Example | | | Comparative Example | | | | | | |
|---|---|---|---|---|---|---|---|---|---|---|
| | 13 | 14 | 15 | 1 | 2 | 3 | 4 | 5 | 6 | 7 |
| Tensile modulus of elasticity*1 | 115 | 103 | 145 | 70 | 45 | 32 | 33 | 192 | 240 | 205 |
| Tensile strength*2 | 4.3 | 4.1 | 5.3 | 2.5 | 1.9 | 1.7 | 1.7 | 7.2 | 12.3 | 8.0 |
| Elongation*3 | 16 | 22 | 15 | 5 | 3 | 3 | 7 | 5 | 2 | 3 |
| Initial thermal decomposition temperature*4 | 500 | 500 | 517 | 450 | 459 | 470 | 460 | 410 | 370 | 415 |
| Glass transition temperature*5 | 225 | 220 | 255 | 215 | 220 | 242 | 231 | 207 | 160 | 210 |
| Thermal expansion coefficient*6 | 45 | 44 | 33 | 48 | 50 | 48 | 53 | 53 | 85 | 55 |
| Dielectric constant*7 | 2.9 | 2.7 | 3.0 | 3.1 | 3.0 | 3.2 | 3.1 | 3.2 | 3.1 | 3.1 |
| Dielectric loss*8 | 8.8 | 8.1 | 9.3 | 8.1 | 8.3 | 8.1 | 8.1 | 13.0 | 11.0 | 13.0 |
| Transparency*9 | ○ | ○ | ○ | X | X | X | X | X | ○ | X |
| Light transmission*10 | 68 | 70 | 55 | — | — | — | — | 5 | 55 | 10 |
| Moisture absorption (%) | 0.3 | 0.2 | 0.2 | — | — | — | — | 0.5 | 0.8 | 0.5 |
| Adhesion | 100 | 100 | 100 | 0 | 0 | 0 | 0 | 50 | 90 | 0 |

(Notes)
*1 Kg/mm$^2$
*2 Kg/mm$^2$
*3 %,
*4 °C., determined by TGA at a test speed of 10° C./minute in a stream of nitrogen,
*5 °C., determined by TMA at a test speed of 10° C./minute in a stream of nitrogen,
*6 ×10$^{-6}$/°C., determined by TMA at a test speed of 10° C./minute in a stream of nitrogen,
*7 Determined at 20° C., 60% relative humidity, and 1 MHz,
*8 ×10$^{-3}$, determined at 20° C., 60% relative humidity, and 1 MHz,
*9 circle, transparent; cross, opaque,
*10 %, determined on a film with a thickness of 50 μm at a wavelength of 500 nm.

What is claimed is:

1. A polyimide copolymer consisting essentially of a repeating unit of the formula (1)

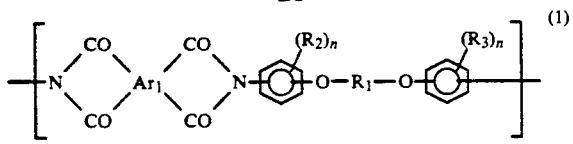

wherein $Ar_1$ is a tetravalent organic radical containing at least one aromatic ring, $R_1$ is a divalent organic radical, each of $R_2$ and $R_3$ is a monovalent hydrocarbon radical, and n is an integer from 0 to 4; and a siloxane-containing repeating unit of the formula (2)

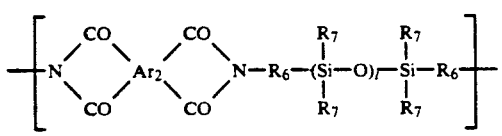

wherein $Ar_2$ is a tetravalent organic radical containing at least one aromatic ring, $R_6$ is a divalent organic radial, $R_7$ is a monovalent hydrocarbon radical with 1 to 6 carbon atoms, and l is an integer from 5 to 50, wherein said polyimide copolymer has a microdomain structure.

2. A polyimide copolymer according to claim 1 wherein the proportion of the repeating unit of the formula (2) is in the range of 1 to 70% by weight of the total quantity of the polyimide copolymer.

3. A polyimide copolymer according to claim 1 wherein $Ar_1$ and $Ar_2$ in the repeating units of the formulas (1) and (2) have a structure of the formula (3)

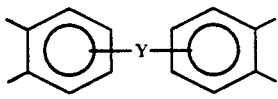

wherein Y is a direct bond, —CO—, —SO$_2$—, —O—, —C(CH$_3$)$_2$—, or —C(CF$_3$)$_2$—.

4. A polyimide copolymer according to claim 1 wherein $R_1$ in the repeating unit of formula (1) has a structure of the formula (4)

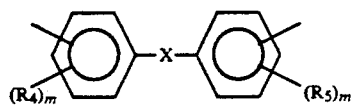

wherein each of $R_4$ and $R_5$ is a monovalent hydrocarbon radical, m is an integer from 0 to 4, and X is a direct bond, —CO—, —SO$_2$—, —O—, —C(CF$_3$)$_2$—, —CH$_2$—, —C(CH$_3$)$_2$—, —CONH—, or

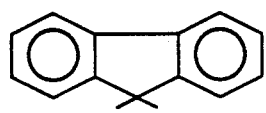

5. A polyimide copolymer according to claim 1 wherein $R_6$ in the repeating unit of formula (2) is —(CH$_2$)$_p$—,

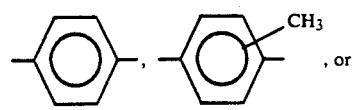

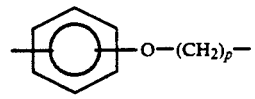

wherein p is an integer from 1 to 5.

6. A polyimide copolymer according to claim 1 wherein $R_7$ in the repeating unit of formula (2) is methyl or phenyl.

7. A resin composition for protection of semiconductors comprising a polyimide copolymer which consists essentially of a repeating unit of the formula (1)

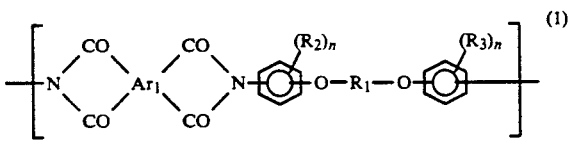

wherein $Ar_1$ is a tetravalent organic radical containing at least one aromatic ring, $R_1$ is a divalent organic radical, each of $R_2$ and $R_3$ is a monovalent hydrocarbon radical, and n is an integer from 0 to 4; and a siloxane-containing repeating unit of the formula (2)

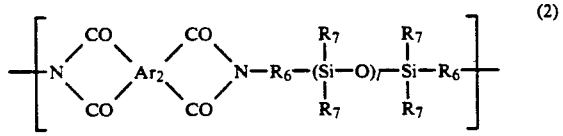

wherein $Ar_2$ is a tetravalent organic radical containing at least one aromatic ring, $R_6$ is a divalent organic radical, $R_7$ is a monovalent hydrocarbon radical with 1 to 6 carbon atoms, and l is an integer from 5 to 50, wherein said polyimide copolymer has a microdomain structure.

8. A semiconductor containing a protective film formed by a resin composition for protection of semiconductors, said composition comprising a polyimide copolymer which consists essentially of a repeating unit of the formula (1)

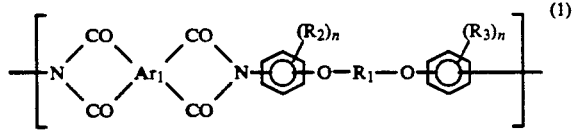

wherein $Ar_1$ is a tetravalent organic radical containing at least one aromatic ring, $R_1$ is a divalent organic radical, each of $R_2$ and $R_3$ is a monovalent hydrocarbon radical, and n is an integer from 0 to 4; and a siloxane-containing repeating unit of the formula (2)

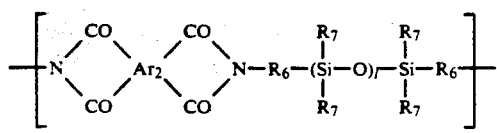

wherein $Ar_2$ is a tetravalent organic radical containing at least one aromatic ring, $R_6$ is a divalent organic radical, $R_7$ is a monovalent hydrocarbon radical with 1 to 6 carbon atoms, and l is an integer from 5 to 50, wherein said polyimide copolymer has a microdomain structure.

9. A process for the preparation of a polyimide copolymer which consists essentially of:
(a) polycondensing a mixture consisting essentially of an aromatic tetracarboxylic acid dianhydride component and a diamine component,
wherein said diamine component consists essentially of
(i) 50 to 99 mole % of at least one diamino compound of the formula (5)

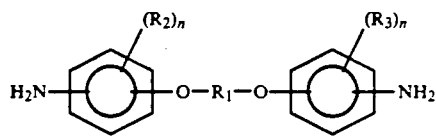

wherein $R_1$ is a divalent organic radical, each of $R_2$ and $R_3$ is a monovalent hydrocarbon radical and n is an integer from 0 to 4, and
(ii) 1 to 50 mole % of at least one diaminosiloxane of the formula (6)

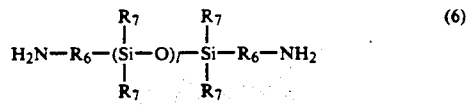

wherein $R_6$ is a divalent organic radical, $R_7$ is a monovalent hydrocarbon radical with 1 to 6 carbon atoms, and l is an integer from 5 to 50, to form a polyimide precursor for a film having a microdomain structure, and
(b) imidizing said polyimide precursor.

10. A process according to claim 9, wherein the aromatic tetracarboxylic acid dianhydride component contains at least one compound of the formula (4)

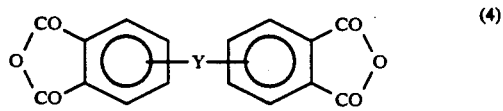

wherein Y is a direct bond, —CO—, —SO$_2$—, —O—, —C(CH$_3$)$_2$—, or —C(CF$_3$)$_2$—.

11. A process according to claim 9, wherein the reaction is carried out in a solvent containing 30% by weight or more of an ether-based solvent.

* * * * *